(12) United States Patent
Bhutada et al.

(10) Patent No.: US 12,092,663 B2
(45) Date of Patent: Sep. 17, 2024

(54) SENSOR PART FOR INSTALLATION IN MEDIUM-VOLTAGE CABLE COMPARTMENTS AND A DEVICE FOR MEASURING A VOLTAGE IN MEDIUM-VOLTAGE CIRCUITS COMPRISING SUCH SENSOR PART

(71) Applicant: EATON INTELLIGENT POWER LIMITED, Dublin (IE)

(72) Inventors: Pradeep Bhutada, Pune (IN); Wilhelmus Van Den Bogaard, Enschede (NL); Elisabeth Morskieft, Hengelo (NL); Yogesh Rajwade, Pune (IN); Tejaswini Shirsath Shirsath, Pune (IN); Adri Lammers, Overijssel (NL)

(73) Assignee: EATON INTELLIGENT POWER LIMITED, Dublin (IE)

( * ) Notice: Subject to any disclaimer, the term of this patent is extended or adjusted under 35 U.S.C. 154(b) by 273 days.

(21) Appl. No.: 17/758,174

(22) PCT Filed: Dec. 21, 2020

(86) PCT No.: PCT/EP2020/087460
§ 371 (c)(1),
(2) Date: Jun. 29, 2022

(87) PCT Pub. No.: WO2021/136710
PCT Pub. Date: Jul. 8, 2021

(65) Prior Publication Data
US 2023/0022633 A1     Jan. 26, 2023

(30) Foreign Application Priority Data

Dec. 31, 2019 (IN) .............................. 201911054653
Feb. 18, 2020 (GB) ...................................... 2002169

(51) Int. Cl.
*G01R 15/18* (2006.01)
*G01R 15/04* (2006.01)
*G01R 19/32* (2006.01)

(52) U.S. Cl.
CPC .......... *G01R 15/181* (2013.01); *G01R 15/04* (2013.01); *G01R 19/32* (2013.01)

(58) Field of Classification Search
CPC ...... G01R 15/181; G01R 15/04; G01R 19/32; G01R 15/16; G01R 15/06
See application file for complete search history.

(56) References Cited

U.S. PATENT DOCUMENTS 4,982,216 A * 1/1991 Kudo ....................... G02B 7/28
                                                           396/97
2013/0234731 A1   9/2013 Tziouvaras
(Continued)

FOREIGN PATENT DOCUMENTS

EP          1345033 A1    9/2003
EP          2508898 A1   10/2012
(Continued)

*Primary Examiner* — Christopher E Mahoney
(74) *Attorney, Agent, or Firm* — LEYDIG, VOIT & MAYER, LTD.

(57) ABSTRACT

Sensor part for installation in medium-voltage cable compartments, which sensor part comprises a voltage divider based on the capacitive divider principle, which voltage divider comprises: —a first capacitor, comprising an elongate primary conductor wrapped in a dielectric material and an elongate conducting shield arranged around the dielectric material, which first capacitor has a first capacitance rating; —a second capacitor, having a second capacitance rating, which second capacitor further comprises a first lead conductively connected with the conducting shield of the first capacitor and a second lead conductively connected to a common reference, such as earth; —a voltage output line, conductively connected with the conducting shield of the (Continued)

first capacitor; wherein the second capacitance rating is larger than the first capacitance rating, so that when during use the primary conductor is conductively connected with a live circuit carrying an alternating current, a measurement of a voltage between the common reference and the voltage output line can be taken as a ratio of the voltage between the live circuit and the common reference.

9 Claims, 6 Drawing Sheets

(56) References Cited

U.S. PATENT DOCUMENTS

| 2013/0335730 A1* | 12/2013 | Shan | G01R 15/241 |
| | | | 356/72 |
| 2014/0368215 A1 | 12/2014 | Hoffman | |

FOREIGN PATENT DOCUMENTS

| EP | 3276363 A1 | 1/2018 |
| GB | 2543754 A | 5/2017 |
| WO | 2018/108828 A1 | 6/2018 |

* cited by examiner

SENSOR PART FOR INSTALLATION IN MEDIUM-VOLTAGE CABLE COMPARTMENTS AND A DEVICE FOR MEASURING A VOLTAGE IN MEDIUM-VOLTAGE CIRCUITS COMPRISING SUCH SENSOR PART

The invention relates to a sensor part for installation in medium-voltage cable compartments, which sensor part comprises a voltage divider based on the capacitive divider principle, which voltage divider comprises:

a first capacitor, comprising an elongate primary conductor wrapped in a dielectric material and an elongate conducting shield arranged around the dielectric material, which first capacitor has a first capacitance rating;

a second capacitor, having a second capacitance rating, which second capacitor further comprises a first lead conductively connected with the conducting shield of the first capacitor and a second lead conductively connected to a common reference, such as earth;

a voltage output line, conductively connected with the conducting shield of the first capacitor;

wherein the second capacitance rating is larger than the first capacitance rating, so that when during use the primary conductor is conductively connected with a live circuit carrying an alternating current, a measurement of a voltage between the common reference and the voltage output line can be taken as a ratio of the voltage between the live circuit and the common reference.

Medium voltage circuits in circuit breaker applications typically need to be instrumented for monitoring, switching and optimization. Due to the dangerously high voltages involved, human interventions on live circuits are strictly prohibited. In order to bring the medium voltage levels within safe measurement ranges, instrument transformers such as current transformers and voltage transformers are commonly applied. The bulky size of these transformers make installation hard and costly.

Present voltage and current transformers can, due to the usage of iron cores, go into saturation mode for their higher side operating voltage and current. Voltage transformers mostly go into saturation due to high ferro magnetic currents. When a current transformer saturates, this can lead to failure in protection and power measurement devices.

Furthermore, varying temperature of current and voltage transformers yields non-linear output. High load currents are a factor in producing non-linear output for measurements as well.

Even when, instead of voltage transformers, voltage dividers using the capacitive divider principle are applied, the temperature variations in the divider cause the output to be non-linear, making measurements inaccurate.

It is an object of the invention to reduce or even remove the above-mentioned disadvantages.

This object is achieved according to the invention with a sensor part according to the preamble, which is characterized in that the sensor part further comprises:

a temperature sensor with a temperature output line, arranged in heat conducting connection with the first capacitor for measuring the temperature of the first capacitor.

By incorporating a temperature sensor, such as for example a platinum resistance thermometer (PRT), in heat conducting connection with the first capacitor, the temperature of the capacitor can be accurately established. The capacitance value of the capacitor is temperature dependent, so by accurately determining the temperature of the capacitor, the actual voltage division can be calculated.

Through the heat conducting connection between the temperature sensor and the capacitor, an accurate reading of the temperature sensor can be determined.

The long term stability of a PRT makes it highly suitable for application in medium voltage cabinets, since it ensures a long operable service life of the sensor part.

The area of the primary conductor enclosed by the shield forms a first capacitance plate of the first capacitor, the conducting shield forms the second capacitance plate of the first capacitor and the dielectric material separating both conductors completes the capacitor.

In another embodiment of a sensor part according to the invention, the dielectric material further extends radially from the conducting shield forming an insulating housing or bushing.

The dielectric material part of the first capacitor can further extend to form a bushing. The first capacitor thus being practically immersed into the insulating material forming the bushing.

Another embodiment of a sensor part according to the invention, is an embodiment in which the temperature sensor is arranged within the dielectric material.

The temperature sensor can be included within the insulating material, so that accurate temperature readings can be obtained of the first capacitor directly, or indirectly through the bushing. The bushing is in heat conducting connection with the capacitor, not in the least since the bushing forms an integral part of the capacitance.

In another embodiment of a sensor part according to invention, the ratio of the first capacitance rating and the second capacitance rating is approximately 1:300, 1:220 or 1:85, for bringing respectively 35 kV, 26 kV or 10 kV within a safe measuring range of 0-120V.

One of the goals for applying instrument transformers is to allow safe measurement on medium voltage circuits. For this, the transformation or division ratio needs to be chosen according to the voltages in which the sensor part will be deployed. Typical secondary proportional voltages are under 120V. It is known for the person skilled in the art how to determine an appropriate ratio in line with for example IEEE or other regulations.

Another, current sensing, embodiment of a sensor part according to the invention, is an embodiment wherein the sensor part further comprises:

a current output line;

a printed circuit board (PCB) Rogowski current sensor comprising a Rogowski coil, wherein the Rogowski coil is conductively connected with the current output line.

By extending the sensor part with a current sensor, the sensor part finds even further application in circuit breaking applications. By replacing the traditionally deployed current transformer with current sensing employing a Rogowski coil, the sensor can be constructed relatively compact. The Rogowski coil furthermore non-saturating and provides good linearity. The Rogowski coil is formed by conductive traces on a circuit board. When the sensor part is in use, the Rogowski coil is placed around a primary conductor carrying an alternating current. The coil voltage between the first and the second end of the Rogowski coil provides a current signature of the current flowing in the primary conductor. The coil voltage is typically in the millivolts range, so the signal is typically further processed at a later stage. The coil inductance displaces the current signature in the coil voltage 90 degrees with respect to the current in the primary conductor. Later processing can further include phase-shifting to correct for the lag in the coil voltage signal.

In another current sensing embodiment of a sensor part according to the invention, the temperature sensor is arranged in heat conducting connection with the Rogowski coil, for measuring the temperature of the Rogowski coil.

By ensuring heat conducting connection between the Rogowski coil, the temperature sensor and the first capacitor, a measurement on the temperature output line can be used to compensate for temperature variations in the measurements from the voltage output line and the current output line.

Alternatively, the sensor part can comprise a second temperature sensor with a second temperature output line, arranged in heat conducting connection with the Rogowski coil for measuring the temperature of the Rogowski coil. This can be useful when a heat conducting connection between the Rogowski coil and the first capacitor cannot easily be achieved. A single temperature measurement can then not be used to correct the measurements. This can be resolved by adding another temperature sensor specific for the Rogowski coil.

The invention further relates to a device for measuring a voltage in medium-voltage circuits, comprising a sensor part according to the invention, wherein the device further comprises a converter part, which converter part comprises a controller for applying a temperature correction to a voltage measurement taken between the voltage output line and the common reference, which controller comprises a corrected voltage signal determined by taking the voltage measurement and applying a correction based on a temperature measurement taken from the temperature output line, for compensating for temperature related variation of the first capacitance rating.

An embodiment of such device according to the invention applies post processing on the output lines, so that the measurements can be used directly in further processing. The converter part, which can for example be connected with the output lines of the sensor part by shielded cables, can comprise a variety of sub-components such as:
- analog input filter(s)
- analog to digital converter(s) (ADC)
- temperature and/or electronic biasing circuit(s)
- microcontroller(s)
- digital to analog converter(s) (DAC)
- communication interface(s)
- volatile or persistent storage(s)

The controller part applies corrections based on the temperature coefficient of the capacitors of the voltage divider of the sensor part, to get more accuracy on the corrected voltage signal. The controller can apply further calibration data as well, which calibration can for example be stored in persistent storage in the converter part. The controller can comprise one or more of the aforementioned sub-components.

The other sub-components can be applied to provide clean, noise free analog signals to the controller. Analog filtering can for example consist of a low-pass filter for filtering out unwanted noise or frequencies in the signal, a buffer (op-amp circuit) for matching circuit impedances, anti-aliasing filter (RC filter) for matching the signal with the characteristics of an attached ADC. It will be apparent for the person skilled in the art how to select and arrange the sub-components.

Another embodiment of a device according to the invention comprises a current sensing sensor part according to the invention, wherein the controller further comprises a corrected current signal determined by taking a secondary voltage measurement between the current output line and the common reference and applying a correction based on a temperature measurement taken from the temperature output line, for compensating for temperature related variation of the Rogowski coil voltage.

Measurements taken from the Rogowski coil can be corrected for temperature induced variations in the levels of the current output line based on a measurement from the temperature output line, or, if so equipped, from the second temperature output line. Calibration data can also be used to further compose the corrected current signal.

In another embodiment of a device according to the invention, the controller comprises updatable firmware for storing and adapting temperature related corrections.

Temperature related coefficients or other calibration data can change. Also variations in capacitance, temperature coefficients, coil sensitivity, etc., introduced during manufacture, make it worthwhile to be able to program the converter part with the appropriate values. This can for example be done during production, or at a later stage, for example when the sensor part is calibrated.

In a further embodiment of the device according to the invention the converter part comprises a cascade of comparators to apply a correction factor depending on in which temperature range the temperature measurement is. The correction factor is applied to the voltage and current.

In yet another embodiment of the device according to the invention a function for the correction factor is implemented in the converter part, which function is dependent on the temperature and is a 1, 2 or higher order function between temperature and correction factor.

Also an embodiment of a device according to the invention, is a device wherein the converter part further comprises a communication port for receiving firmware and/or communicating the corrected voltage signal or the corrected current signal.

In order to support field-updatability of the controller and/or to communicate with the converter part for obtaining corrected signals or other derivatives, such as frequency, active/reactive power, power factor, etc., a communication port, such as a serial port, SPI lines, USB, Ethernet or other communication ports can be arranged in the converter part.

These and other features of the invention will be elucidated in conjunction with the accompanying drawings.

Figure 1:
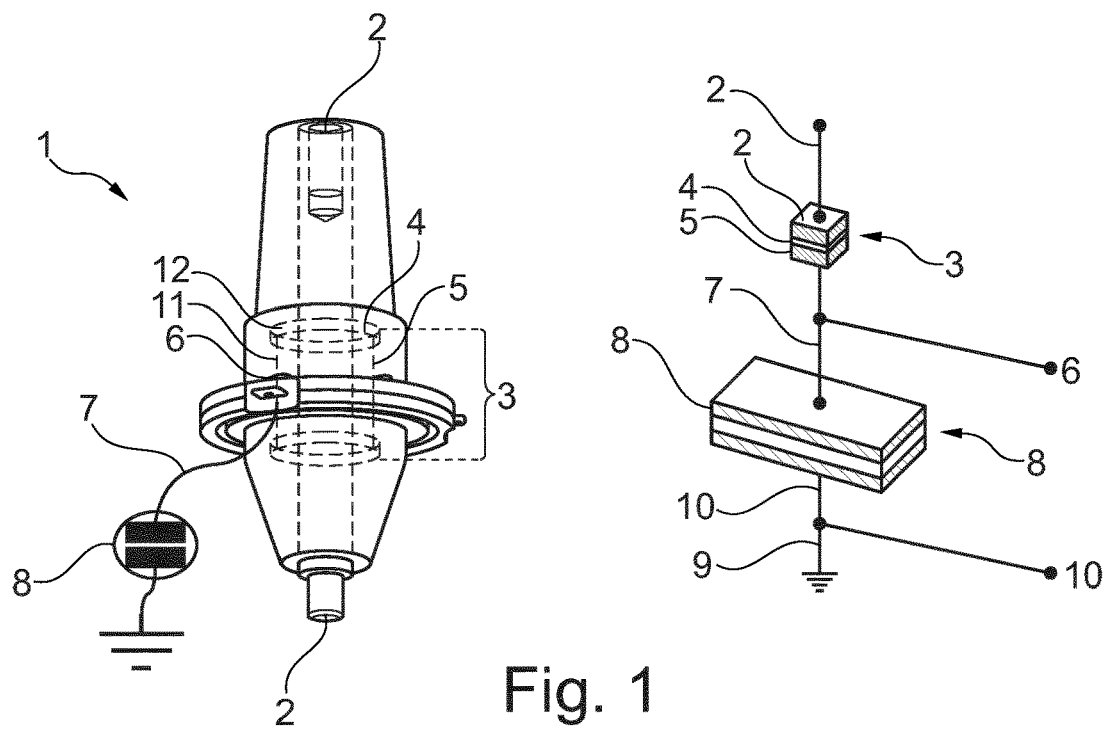
FIG. 1 shows a side-by-side view of an embodiment of a sensor part according to the invention with marked out inner components and a schematic representation of the same sensor part.

FIG. 1 shows a side-by-side view of an embodiment of a sensor part 1 according to the invention with marked out inner components and a schematic representation of the same sensor part. The sensor part 1 in the form of a bushing, has the primary conductor 2 running through the core of the bushing 1. The first capacitor 3 is formed by the elongate primary conductor 2, the dielectric material 4 which surrounds the primary conductor 2 and the conductive shield 5 enclosing the primary conductor 2. The conductive shield 5 forms one plate of the capacitance. The part of the primary conductor 2 enclosed by the conductive shield 5 forms the other plate.

Conductively connected with the conducting shield 5 is a voltage output line 6, as well as the first lead 7 of the second capacitor 8. The second lead 9 of the second capacitor 8 is for conductively connecting, during use of the sensor part, to a common reference 10, such as earth.

Close to the conducting shield 5 and the primary conductor 2, a temperature sensor 11 is arranged. It is in heat conducting connection with the first capacitor 3. The temperature output line 12 allows measurements of the temperature sensor to be taken. While in this figure the second capacitor 8 is placed outside the bushing 1, which is typically arranged in an auxiliary component, such as a converter part.

Figure 2:
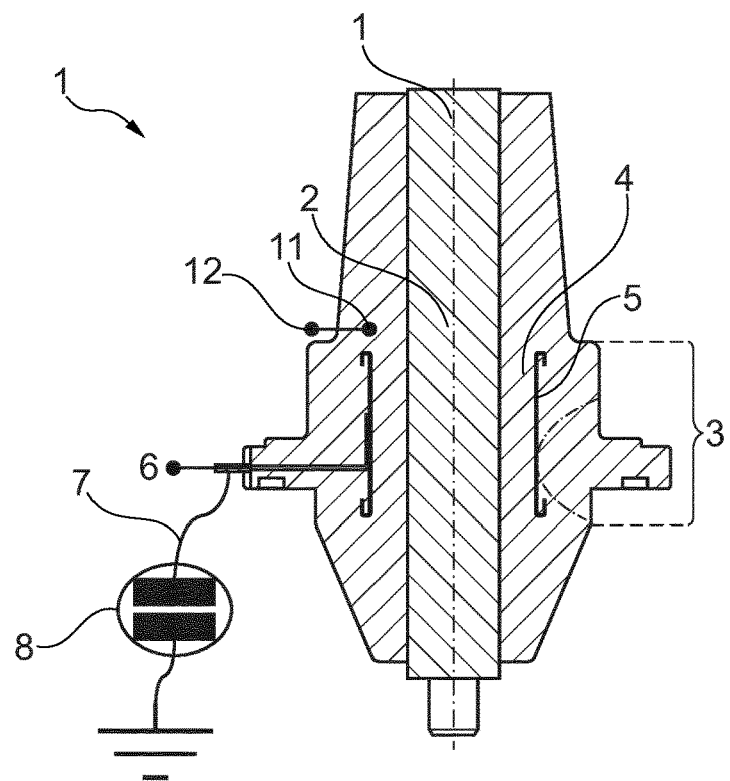
FIG. 2 shows a cross-sectional view of the embodiment of the sensor part according to the invention.

FIG. 2 shows a cross-sectional view of the embodiment of the sensor part 1 according to the invention. The dielectric material 4 wrapped around the primary conductor 2 en further extending radially to form the housing of the bushing 1. The conducting shield 5 formed around the primary conductor 2 is conductively connected with the voltage output line 6 as well as with the first lead 7 of the second capacitor 8.

The figure clearly shows the dielectric material 4 continuing between the conducting shield 5 and the primary conductor 2. The region is marked where the primary conductor 2 is enclosed in the conducting shield 5, forming the first capacitor 3.

The temperature sensor 11 arranged near the capacitor 3 is connected with the temperature output line 12.

Figure 3:
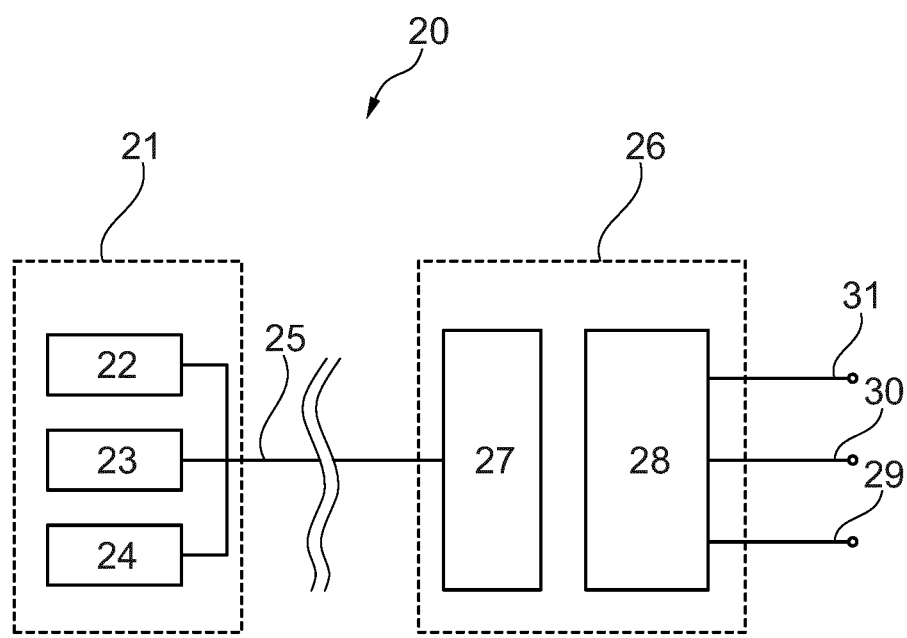
FIG. 3 shows a schematic view of a device according to the invention.

FIG. 3 shows a schematic view of a device 20 according to the invention. The sensor part 21 has a voltage sensor 22 according to the capacitive divider principle, a temperature sensor 23 and a current sensor 24. A shielded interface cable 25 connects the sensor part 21 with the converter part 26. The converter part 26 comprises an analog filtering stage 27 which is connected with a controller 28. A communication port 29 allows the converter part 26 to be connected with further devices. The interface cable 25 has several cores, such as two cores for the temperature sensor 23, two cores for the current sensor 24 and a single core for the voltage sensor 22.

The corrected voltage signal 30 and the corrected current signal 31 are supplied by the controller 28.

Figure 4A:
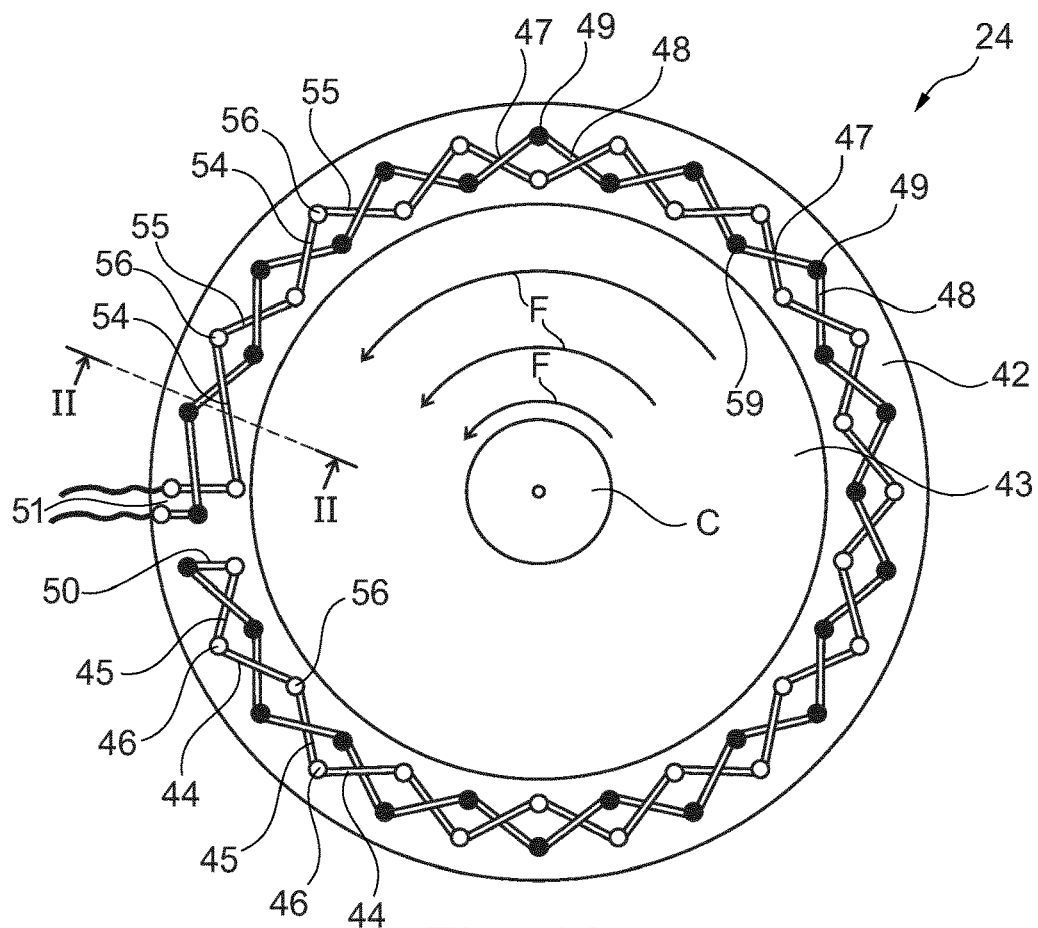
FIGS. 4A and 4B show an embodiment of a current sensor for use in the device according to the invention.
Figure 4B:
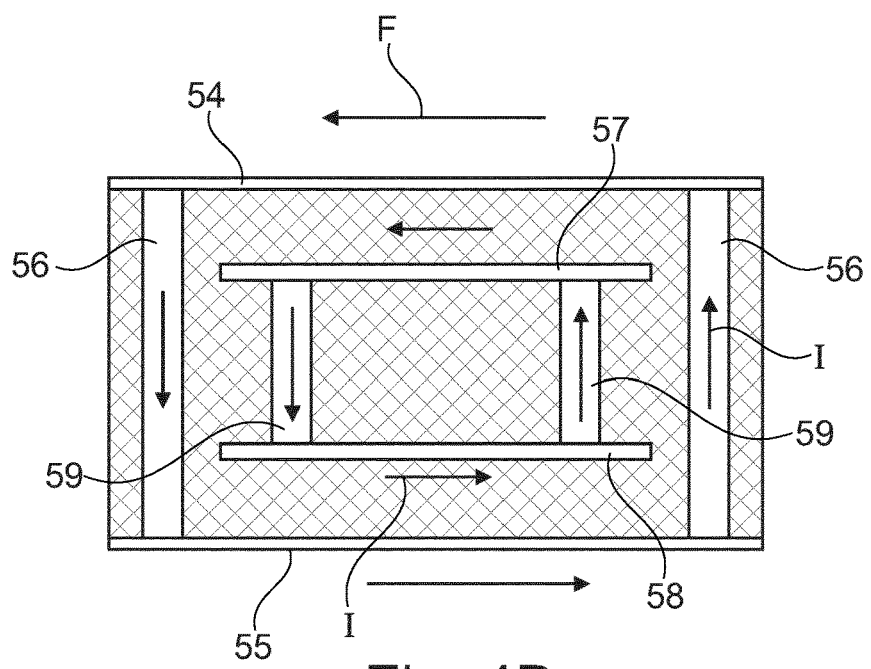

FIGS. 4A and 4B show an embodiment of a current sensor 24 for use in the device according to the invention. The current sensor 24 is a Rogowski coil, known from EP 3502714, which has a printed circuit board 42 with a central passage opening 43 through which a conductor C extends.

The Rogowski coil 24 has a first winding composed out of tracks 44, 45 and vias 46 and a second, return winding composed out of tracks 47, 48 and vias 49. The first winding 44, 45, 46 and the second, return winding 47, 48, 49 are arranged in series at the coupling 50, where the first winding is electrically connected to the second winding.

The conductor C generates an magnetic field F, which causes a current I in the first winding 44, 45, 46 and the second, return winding 47, 48, 49. (see FIG. 4B). As the first and second winding have opposite direction of rotation around the respective axis and because the second winding 47, 48, 49 returns back towards the start 51 of the first winding 44, 45, 46, the current I in the first and second windings support each other, such that the sensitivity of the Rogowski coil 24 is increased.

Figure 5A:
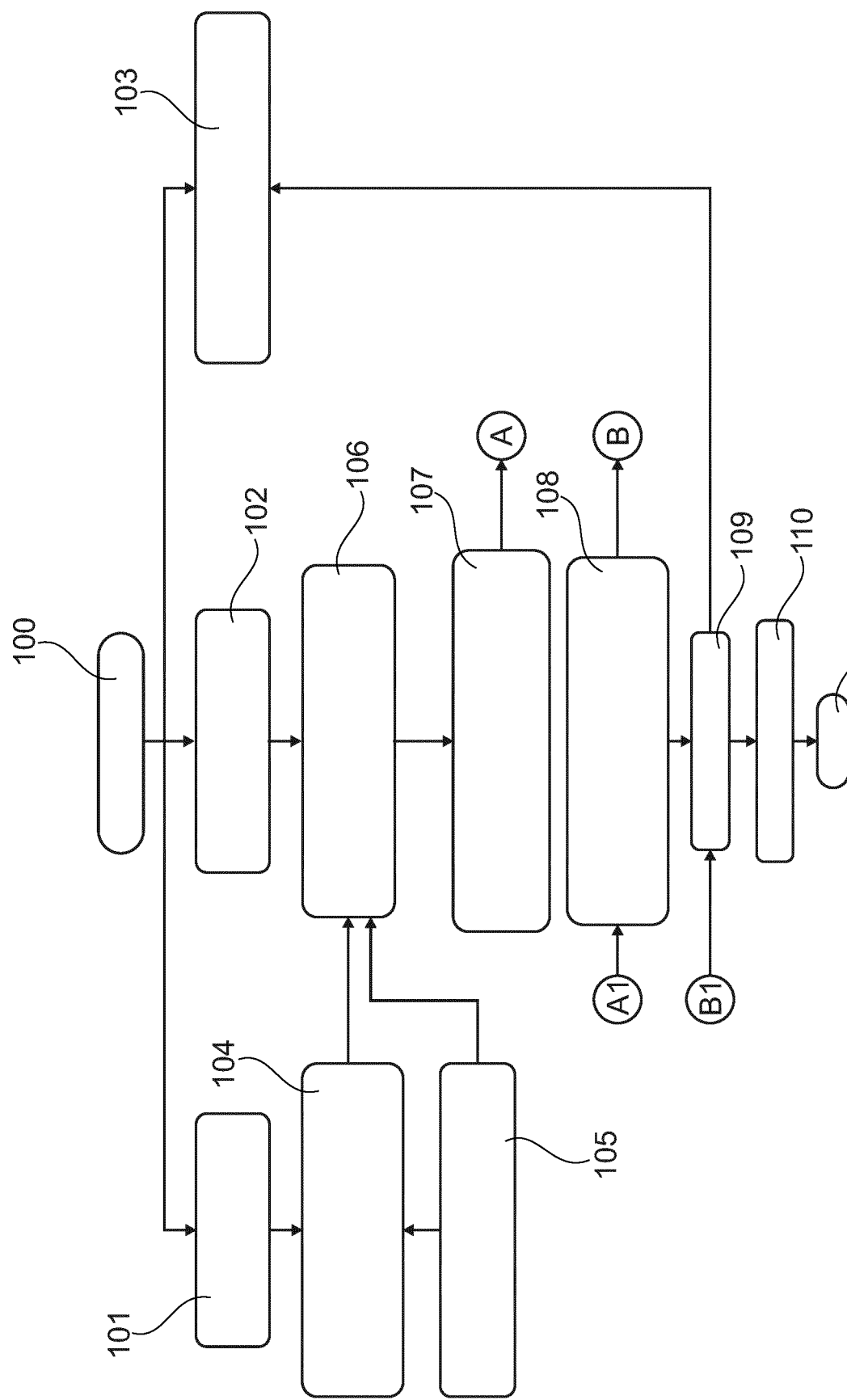
FIGS. 5A, 5B and 5C show a diagram of a method performed in the converter part of the schematic view of FIG. 3.
Figure 5B:
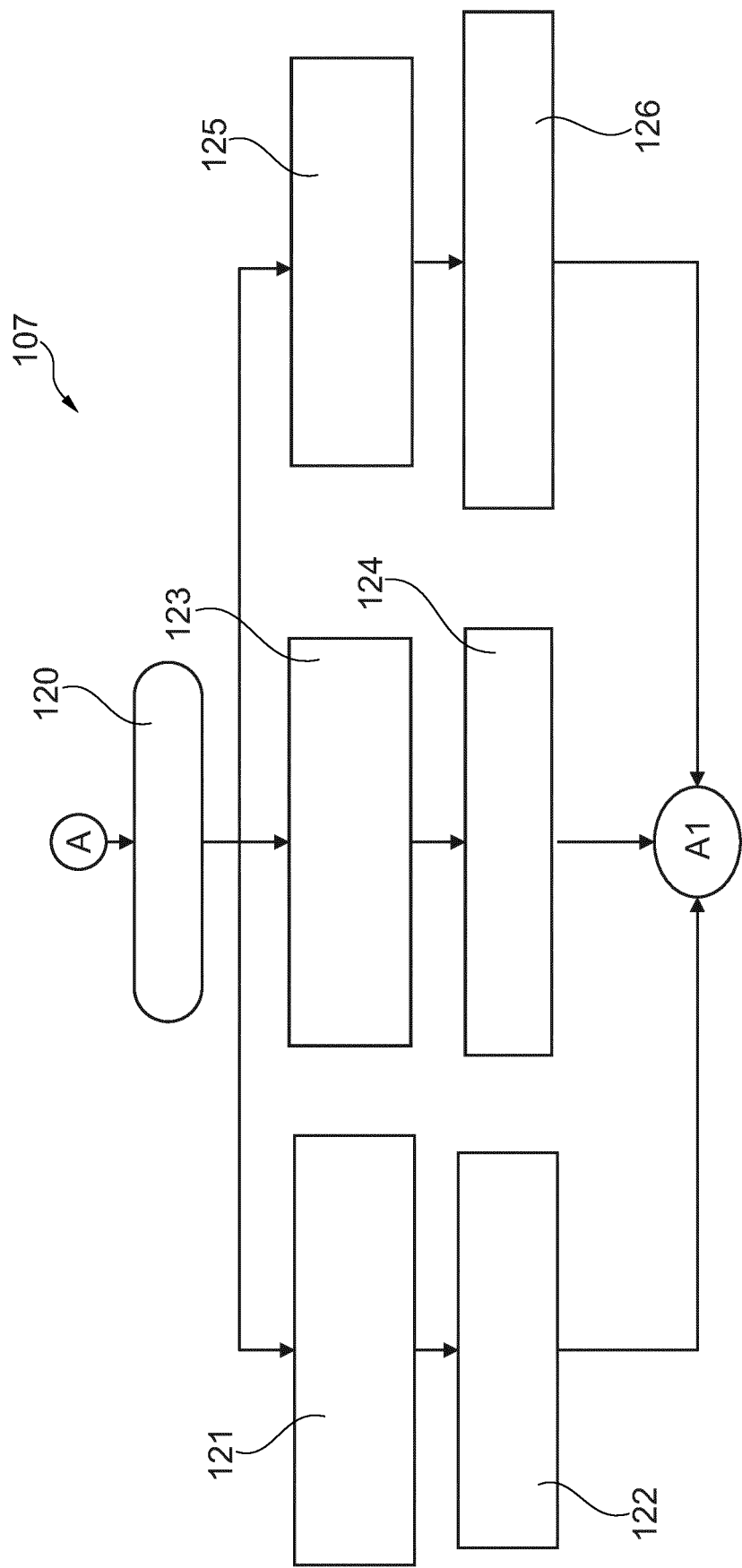
Figure 5C:
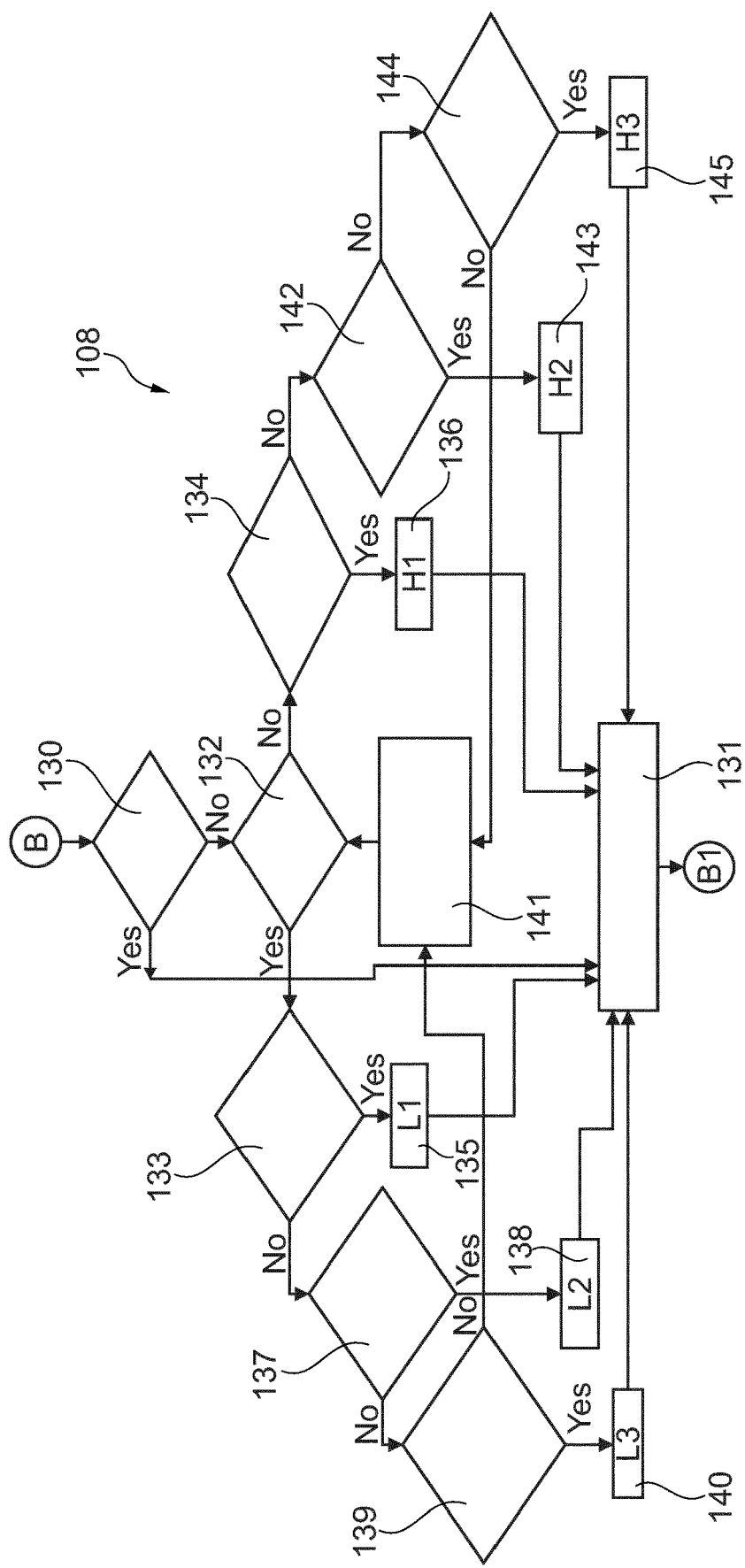

FIGS. 5A-5C shows a diagram of a method performed in the converter part 26. The method starts with powering on or starting the method at 100. This ensures that the analog to digital converter is initialized at 101, the microcontroller is initialized at 102 and the digital to analog converter for the external interface is initialized at 103.

Then the output of the voltage sensor 22 and the output of the current sensor 24 are read at 104. These readings together with the output 105 of the temperature sensor are converted into a digital signal at 106. These digital signals are fed to a calibration module 107, which is explained in more detail in FIG. 5B.

The output of the calibration module 107 is then fed to a compensation module 108, which compensates for temperature. The output of the compensation module 108 is the provided to an external interface 109 and a digital interface 110, such that the method ends at 111.

FIG. 5B shows the method steps performed in the calibration module 107 in more detail.

At 120 the configuration of the calibration module 107 is started. Then the configuration factor for the voltage signal is determined at 121, which is then applied to the voltage signal at 122 to obtain the line voltage of the primary conductor 2. For the current, the configuration factor is determined at 123 and then applied at 124 to obtain the line current. And the temperature configuration factor is determined at 125 and then applied on the temperature signal to obtain the bushing temperature at 126.

FIG. 5C shows the method steps performed in the compensation module 108. Although a lookup table would be obvious to use, the electronics to implement such a lookup table in a high voltage sensor according to the invention, would be costly. Therefor, an alternative temperature compensation is applied, which allows the use of low cost electronics.

First of all the bushing temperature provided by the configuration module 107 is compared to a reference temperature, for example 25° C., at comparator 130. If the bushing temperature is exactly this reference temperature, then the temperature compensation is skipped and the method steps end at 131.

At 132 it is checked if the bushing temperature is lower than the reference temperature. If so, the method continues to the next comparator 133, and if not, the method continues at the comparator 134.

At the comparator 133 it is checked whether the bushing temperature is higher than 5° C., so whether the temperature is thus between 5° C. and 25° C. If so, a first correction factor L1 is provided at 135 and applied at 131, where the method steps end.

Similarly, the comparator 134 checks whether the bushing temperature is between 25° C. and 45° C., and if so, a correction factor H1 is provided at 136.

The comparator 137 compares the temperature with the range 4° C. and −15° C. and provides the factor L2 at 138 if the bushing temperature is within said range.

The comparator 139 compares the temperature with the range of −15° C. and −40° C. and applies the factor H3 at 140 if there is a match. However, if there is no match with this last temperature range, then the method continues to step 141 to wait for a new reading of the bushing temperature, as apparently the current bushing temperature was a falls reading.

For the temperatures above the reference temperature of 25° C., the comparator 142 checks for the range 45° C. and 65° C. and applies a factor H2 at 143, and the comparator 144 checks for the range 65° C. and 90° C. and provide the factor H3 if there is a match.

It is clear for a person skilled in the art that the number of comparators in this cascade of comparators can be altered to provide a higher or lower compensation accuracy. Also the temperature ranges assigned to the comparators can be defined based on the requirements of the specific case and sensor.

The invention claimed is:

1. A device for measuring a voltage in medium-voltage circuits, the device comprising:
    sensor part for installation in medium-voltage cable compartments, which sensor part comprises a voltage divider based on the capacitive divider principle, which voltage divider comprises:
        a first capacitor, comprising an elongate primary conductor wrapped in a dielectric material and an elongate conducting shield arranged around the dielectric material, which first capacitor has a first capacitance rating, wherein a part of the primary conductor enclosed by the conducting shield forms a first capacitance plate of the first capacitor and the conducting shield forms a second capacitance plate of the first conductor;
        a second capacitor, having a second capacitance rating, which second capacitor further comprises a first lead conductively connected with the conducting shield of the first capacitor and a second lead conductively connected to a common reference, such as earth; and
        a voltage output line, conductively connected with the conducting shield of the first capacitor;
    wherein the second capacitance rating is larger than the first capacitance rating, so that when during use the primary conductor is conductively connected with a live circuit carrying an alternating current, a measurement of a voltage between the common reference and the voltage output line can be taken as a ratio of the voltage between the live circuit and the common reference,
    wherein the sensor part further comprises a temperature sensor with a temperature output line, arranged in heat conducting connection with the first capacitor for measuring the temperature of the first capacitor, and
    wherein the device further comprises a converter part, which converter part comprises a controller for applying a temperature correction to a voltage measurement taken between the voltage output line and the common reference, which controller comprises a corrected voltage signal determined by taking the voltage measurement and applying a correction based on a temperature measurement taken from the temperature output line, for compensating for temperature related variation of the first capacitance rating,
    wherein the converter part comprises a cascade of comparators to apply a correction factor depending on in which temperature range the temperature measurement is.

2. The device according to claim 1, wherein the dielectric material further extends radially from the conducting shield forming an insulating housing or bushing.

3. The device according to claim 1, wherein the temperature sensor is arranged within the dielectric material.

4. The device according to claim 1, wherein the ratio of the first capacitance rating and the second capacitance rating is approximately 1:300, 1:220 or 1:85, for bringing respectively 35 kV, 26 kV or 10 kV within a safe measuring range of 0-120V.

5. The device according to claim 1, wherein the sensor part further comprises:
    a current output line;
    a printed circuit board Rogowski current sensor comprising a Rogowski coil, wherein the Rogowski coil is conductively connected with the current output line.

6. The device according to claim 5, wherein the temperature sensor is arranged in heat conducting connection with the Rogowski coil, for measuring the temperature of the Rogowski coil.

7. The device according to claim 5, wherein the controller further comprises a corrected current signal determined by taking a secondary current measurement between the current output line and the common reference and applying a correction based on a temperature measurement taken from the temperature output line, for compensating for temperature related variation of the Rogowski coil voltage.

8. The device according to claim 1, wherein the controller comprises updatable firmware for storing and adapting temperature related corrections.

9. The device according to claim 1, wherein the converter part further comprises a communication port for receiving firmware and/or communicating the corrected voltage signal or the corrected current signal.

* * * * *